United States Patent
Solomko et al.

(10) Patent No.: US 9,685,687 B2
(45) Date of Patent: Jun. 20, 2017

(54) SYSTEM AND METHOD FOR A DIRECTIONAL COUPLER

(71) Applicant: Infineon Technologies AG, Neubiberg (DE)

(72) Inventors: Valentyn Solomko, Munich (DE); Bogdan-Nicolae Tanc, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/837,405

(22) Filed: Aug. 27, 2015

(65) Prior Publication Data

US 2016/0079650 A1 Mar. 17, 2016

Related U.S. Application Data

(60) Provisional application No. 62/050,314, filed on Sep. 15, 2014.

(51) Int. Cl.
| | |
|---|---|
| *H01P 5/18* | (2006.01) |
| *H03H 7/48* | (2006.01) |
| *H03H 7/38* | (2006.01) |
| *H01P 1/10* | (2006.01) |

(52) U.S. Cl.
CPC .............. *H01P 5/18* (2013.01); *H03H 7/48* (2013.01)

(58) Field of Classification Search
CPC .................................. H01P 5/18; H01P 5/184
USPC ......................................... 333/109–112, 116
See application file for complete search history.

(56) References Cited

U.S. PATENT DOCUMENTS

| | | | | |
|---|---|---|---|---|
| 4,701,724 | A * | 10/1987 | Martin ..................... | H04B 1/48 333/103 |
| 5,038,112 | A * | 8/1991 | O'Neill .................... | H03G 7/00 330/207 P |
| 5,363,071 | A * | 11/1994 | Schwent .................. | H01P 5/04 333/111 |
| 5,745,016 | A * | 4/1998 | Salminen ................. | G01R 1/24 324/95 |
| 6,329,880 | B2 * | 12/2001 | Akiya ...................... | H03F 1/52 330/207 P |
| 6,873,224 | B2 * | 3/2005 | Chominski .............. | H03H 7/52 333/112 |
| 7,538,635 | B2 * | 5/2009 | Fukuda ................... | H01P 5/227 333/111 |
| 8,175,554 | B2 * | 5/2012 | Camuffo ............. | H03G 3/3042 455/126 |
| 8,315,576 | B2 * | 11/2012 | Jones ...................... | H01P 5/184 333/109 |
| 8,508,296 | B1 * | 8/2013 | Mustafa .................. | H03F 1/565 330/124 R |
| 9,300,022 | B2 * | 3/2016 | Vaisman ................. | H03H 7/422 |
| 2012/0013418 | A1 * | 1/2012 | Park ........................ | H04B 1/18 333/109 |
| 2013/0147535 | A1 * | 6/2013 | Hur .......................... | H01P 5/18 327/231 |

(Continued)

FOREIGN PATENT DOCUMENTS

KR 20140128025 A 11/2014

*Primary Examiner* — Dean Takaoka (74) *Attorney, Agent, or Firm* — Slater Matsil, LLP (57) ABSTRACT

In accordance with an embodiment, a circuit includes a directional coupler having a plurality of ports comprising an input port, a transmitted port, an isolated port and a coupled port, and an adjustable termination coupled to at least one of the plurality of ports.

23 Claims, 10 Drawing Sheets (56) References Cited

U.S. PATENT DOCUMENTS

| | | | |
|---|---|---|---|
| 2013/0194054 A1* | 8/2013 | Presti | H04B 1/0458 333/112 |
| 2014/0321009 A1 | 10/2014 | Kwak et al. | |
| 2015/0091668 A1* | 4/2015 | Solomko | H01P 5/18 333/109 |
| 2015/0200437 A1* | 7/2015 | Solomko | G01R 21/07 333/2 |
| 2016/0065167 A1* | 3/2016 | Granger-Jones | H01F 38/14 333/112 |
| 2016/0079649 A1* | 3/2016 | Ilkov | H03H 7/383 343/853 |
| 2016/0172737 A1* | 6/2016 | Srirattana | H01P 5/184 333/111 |
| 2016/0172738 A1* | 6/2016 | Srirattana | H01P 5/184 333/111 |
| 2016/0172739 A1* | 6/2016 | Srirattana | H01P 5/184 333/111 |
| 2016/0172740 A1* | 6/2016 | Srirattana | H01P 5/184 333/111 |

\* cited by examiner

SYSTEM AND METHOD FOR A DIRECTIONAL COUPLER

This application claims priority to U.S. Provisional Application Ser. No. 62/050,314 filed on Sep. 15, 2014 and entitled "System and Method for a Directional Coupler," which application is hereby incorporated herein by reference in its entirety.

TECHNICAL FIELD

The present disclosure relates generally to an electronic device, and more particularly to a system and method for a directional coupler.

BACKGROUND

Directional couplers, which are electronic devices that can detect power being transmitted in a particular direction, are used in a wide variety of radio frequency (RF) circuits. For example, a directional coupler may be used in a radar system to detect a reflected wave by separating the indecent wave from the reflected wave, or may be used in a circuit that measures the impedance mismatch of transmission lines. Functionally, a directional coupler has a forward transmission path and a coupled transmission path. The forward transmission path generally has a low loss, while the coupled transmission path couples a fraction of the transmission power that is propagated in a particular direction. There are many different types of coupler architectures that include electromagnetic couples and magnetic couplers. Each of these coupler types may be implemented using different topologies and materials depending on the frequency of operation and the operational environment.

One common application for a directional coupler is the detection of the reflected and transmitted power in a portable radio frequency (RF) device such as a cellular telephone or a portable computing device. The measurement of the transmitted power may be used in a control loop to adjust the output of a power amplifier, while the measurement of the reflected power in conjunction with the measurement of the reflected power may be used to adjust adjustable antenna matching networks. One parameter that limits the accuracy of such reflected power measurements is the directivity of the directional coupler, which is related to the ability of the directional coupler to isolate a measurement from an incident wave to a reflected wave.

SUMMARY OF THE INVENTION

In accordance with an embodiment, a circuit includes a directional coupler having a plurality of ports comprising an input port, a transmitted port, an isolated port and a coupled port, and an adjustable termination coupled to at least one of the plurality of ports.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a directional coupler that may be used, for example, in RF circuits to measure incident or reflected power. Embodiments of the present invention may also be applied to other systems and applications including other circuits having directional couplers and RF systems with selectable signal paths. Moreover, embodiments may be directed to systems that make RF measurements including, but not limited to devices that measure and/or tune impedance mismatch, time domain reflectometers (TDR), sensing devices for use with tunable antenna matching circuits, and tunable filters.

In an embodiment of the present invention, a directional coupler circuit includes a directional coupler having an input port and a transmitted port. The directional coupler also includes an isolated port on which a signal that propagates from the transmitted port to the input port is coupled, and coupled port on which a signal that propagates from the input port to the transmitted port is coupled. An adjustable termination impedance is coupled to isolated port and/or the coupled port in order to improve the directivity of the directional coupler.

Embodiment directional coupler systems may be used, for example, in RF front-end systems and front-end multi-chip modules for cellular handsets. Such directional coupler systems, for example, may be specifically used in reconfigurable RF front-ends for cellular handsets. Embodiment directional coupler systems may be used in RF front-end systems to sense the power transmitted from PA to antenna and the power reflected from antenna back to PA due to impedance mismatch at the various ports in the system. In such systems, an embodiment directional coupler provides a high directivity, for example greater than 25 dB, within the frequency range of about 0.5 GHz to about 3.8 GHz. In conventional systems, this is normally achieved by using passive directional couplers implemented in technologies comprising high-Q passive components. Embodiment tunable couplers may be monolithically integrated on a silicon or other semiconductor substrate to achieve high directivity. In some embodiments, a high directivity of at least 25 dB within the 0.5 GHz to 3.8 GHz frequency range of handheld mobile devices by tuning the load impedance at the coupled and/or isolated ports of the directional coupler.

In conventional directional couplers, high directivity may be achieved by implementing broadband couplers in IPD (integrated passive devices) technologies or other passive technologies comprising thick metallization and offering high-Q passive structures. Thus, when a direction select switch is used, an IPD coupler is often integrated in a module with RF switches. Dual couplers also offer high directivity in the wide frequency range, and are able to simultaneously provide signals at coupled and isolated ports but may have a higher insertion loss compared to single couplers.

According to various embodiments, couplers are based on magnetic transformers and tunable passive capacitors and resistors that may be monolithically integrated together. High directivity is achieved by tuning a termination resistor and/or capacitor coupled the isolated port or coupled port of the directional coupler to achieve high directivity in each frequency band. The advantages of the proposed approach include monolithic integration of the coupler in RF switch process that offers high directivity in a frequency range of between about 0.5 GHz and about 3.8 GHz with low insertion loss.

The directivity of a directional coupler strongly depends on the quality of termination at the isolated port. State-of-the-art couplers with high directivity are often based on dual-coupler structures with each coupler terminated separately with well-controlled impedance. Such couplers are able to provide simultaneously signals at coupled and isolated ports. In modern RF-front-end systems for mobile handheld devices a single output, either coupled or isolated, is monitored at a time. This means that the isolated port may be terminated with a well-controlled or tunable impedance without having any interface with external components, while coupled port can be monitored by a transceiver system. In such configurations, bi-directional operation and high directivity may be achieved at the same time by switching between coupled and isolated ports of the directional coupler and by tuning the termination impedance to achieve the best directivity.

Figure 1A:
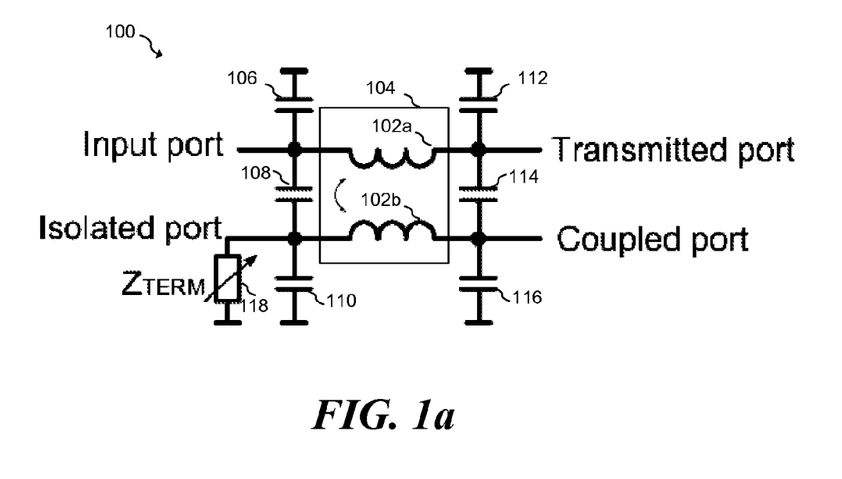
FIGS. 1a-1b illustrate embodiment directional coupler systems.

FIG. 1a illustrates directional coupler 100 that may be used to implement directional couplers in various embodiments. As shown, directional coupler 100 is implemented using transformer 104 with one winding 102a coupled between the input port and the transmitted port, and another winding 102b coupled between the isolated port and the coupled port and magnetically coupled to winding 102a. Transformer 104 may be implemented using circuits and systems known in the art. For example, in one embodiment, transformer 104 may be implemented using stacked or adjacent spiral inductors disposed on an integrated circuit. In a further embodiment, transformer 104 may be implemented using a stripline transformer disposed on a substrate. Alternatively, other directional couple circuits and structures may be used besides the transformer-base coupled illustrated in FIG. 1a. In an embodiment, capacitors 106, 108, 110, 112, 114 and 116 are coupled to transformer 104.

Directional coupler 100 further includes adjustable termination impedance 118 that may be used to tune the directivity of directional coupler 100. This adjustable termination impedance 118 may be implemented using switchable resistances structures known in the art. For example, in one embodiment, switchable resistance circuits that include a resistor coupled in series with a switch may be connected in series to implement an adjustable resistive termination. Alternatively, other adjustable and/or switchable impedance circuits known in the art may be used. In an embodiment, adjustable termination impedance 118 may be adjusted to have a resistance value between about 20 Ohms and about 100 Ohms that is programmable with between about 1 Ohm and 2 Ohms of granularity. In one embodiment, adjustable termination impedance 118 is programmable using a 6-bit digital word for a total of 64 steps. In alternative embodiments, termination impedance may have different ranges of programmable impedances and different granularity depending on the particular embodiment and its specifications.

Figure 1B:
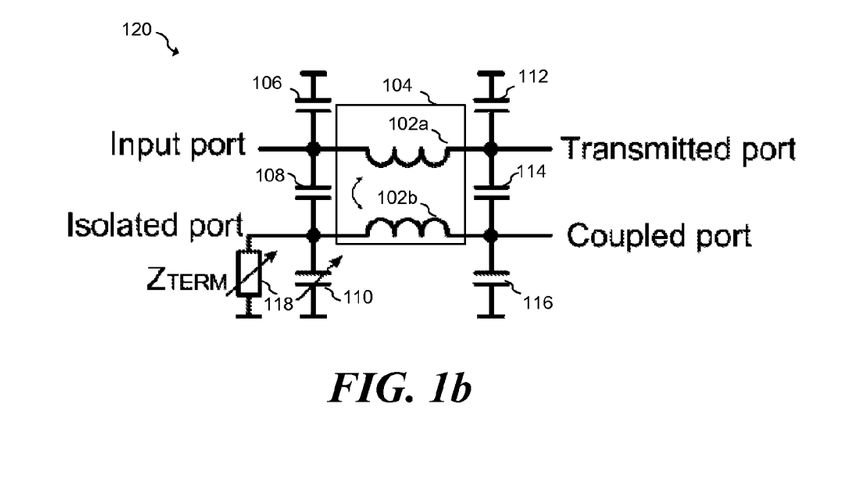

In an embodiment, a switchable capacitance circuit may be used in place of or in additional to a switchable resistance circuit, as shown with respect to directional coupler 120 in FIG. 1b. Here, capacitor 110 coupled to the isolated port of directional coupler 120 is shown as being an adjustable capacitor. In an embodiment, adjustable capacitor 110 may be adjusted to have a capacitance value between about 0 fF and 1 pF; however, capacitance values higher than 1 pF may also be used depending on the particular application and its specifications. When adjustable termination impedance 118 is implemented using an adjustable resistance, the combination of the adjustable resistance and adjustable capacitor 110 may be used to implement part of an admittance and the adjustable capacitor 110 provides the imaginary part of the admittance. In alternative embodiments, other components besides adjustable resistances and capacitances may be used to implement the adjustable impedance. For example, a switchable inductance may be used in some embodiments. Moreover, different adjustable impedance topologies may be used. For example, an adjustable series combination of an adjustable resistor and an adjustable capacitor may also be used. In some embodiments, directional coupler 120, including transformer 104, adjustable termination impedance 118, adjustable capacitor 110, as well as capacitors 106, 108, 112, 114 and 116 may be integrated on a single integrated circuit. Alternatively, the various components may be integrated on a printed circuit board (PCB) using stripline components, passive components, active components and a combination thereof.

Figure 2A:
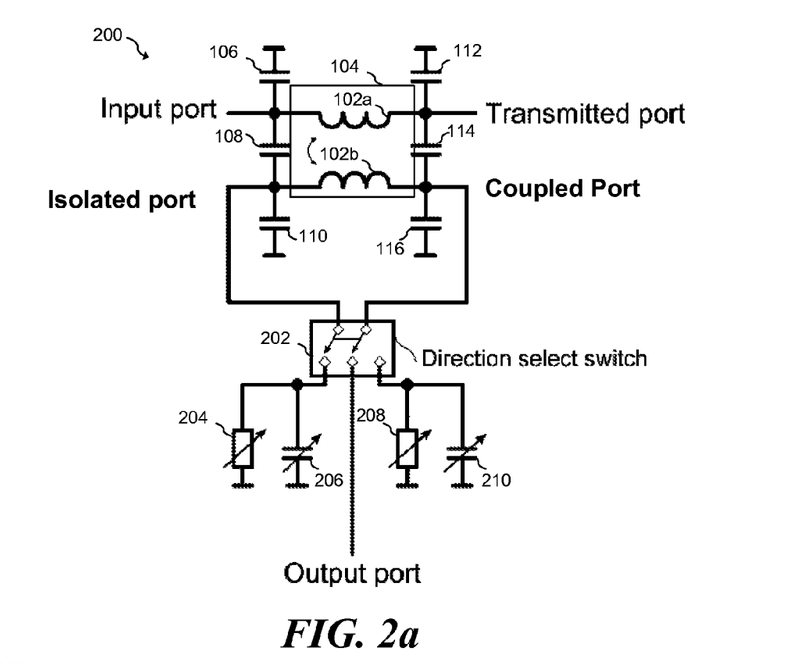
FIG. 2a-2b illustrate embodiment directional coupler systems with a direction select switch.

FIG. 2a illustrates a tunable directional coupler 200 according to an embodiment of the present invention that includes direction select switch 202 in addition to the directional coupler constructed of transformer 104. As shown, direction select switch includes two switches. One switch selectively couples the isolated port the output port of the direction select switch to a first termination port coupled to adjustable resistor 204 and adjustable capacitor 206. The other switch selectively couples the coupled port the output port of the direction select switch to a second termination port coupled to adjustable resistor 208 and adjustable capacitor 210. Each of adjustable resistors 204 and 208 and adjustable capacitors 206 and 210 may be adjusted to increase the directivity of tunable directional coupler 200. In some embodiments, transformer 104, capacitors 106, 108, 110, 112, 114 and 116, direction select switch 202, adjustable resistors 204 and 208, and adjustable capacitors 206 and 210 may be implemented on a single integrated circuit die. Alternatively, these components may be disposed on more than one integrated circuit and/or using discrete components or a combination thereof.

Figure 2B:
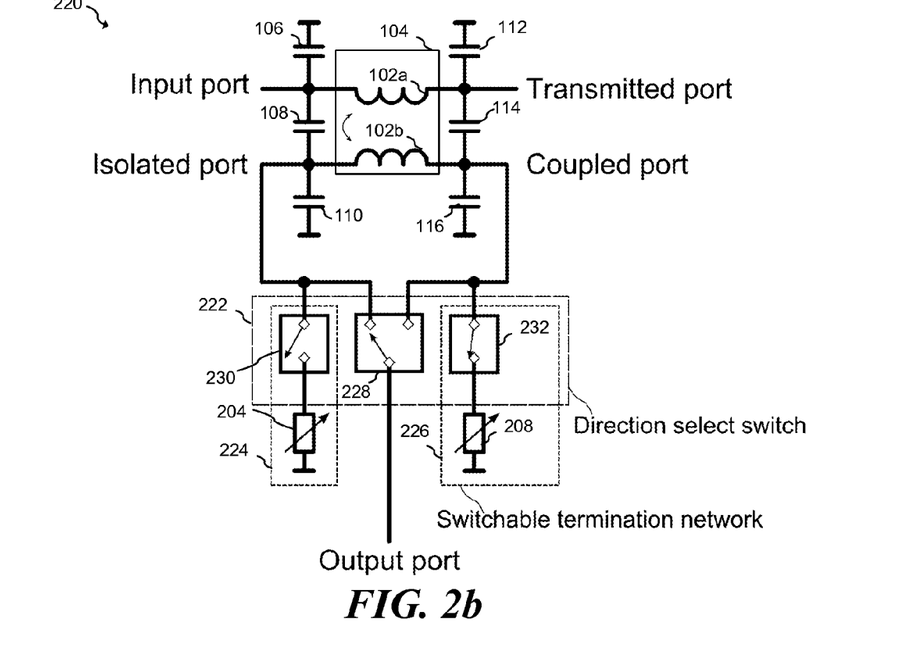

FIG. 2b illustrates embodiment tunable directional coupler 220 that includes direction select switch 222 that selectively couples the output port to one of the isolated port and the coupled port and terminates the unselected port. As shown, direction select switch 222 includes one single pole double throw (SPDT) switch 228 that connects one of the isolated port and the coupled port to the output port, a single pole single throw (SPST) switch 230 coupled to adjustable termination resistor 204 and SPST switch 232 coupled to adjustable termination resistor 208. The combination of SPST switch 230 and adjustable termination resistor 224, and the combination of SPST switch 232 and 208 may also be considered as switchable termination networks 224 and 226, respectively.

In some embodiments, switches 230 and 232 of switchable termination networks 224 and 226 are implemented using only RF switches. For example, the function of SPST switches 232 and 230 in switchable termination networks 224 and 226 are distributed within adjustable resistors 204 and 208 themselves, which may be implemented using the channel resistance of switchable transistors to tune the real part of the impedance of switchable termination networks 224 and 226. These switchable transistors may be implemented, for example, using NMOS transistors. Alternatively, other transistor types such as PMOS transistors may be used.

Figure 3A:
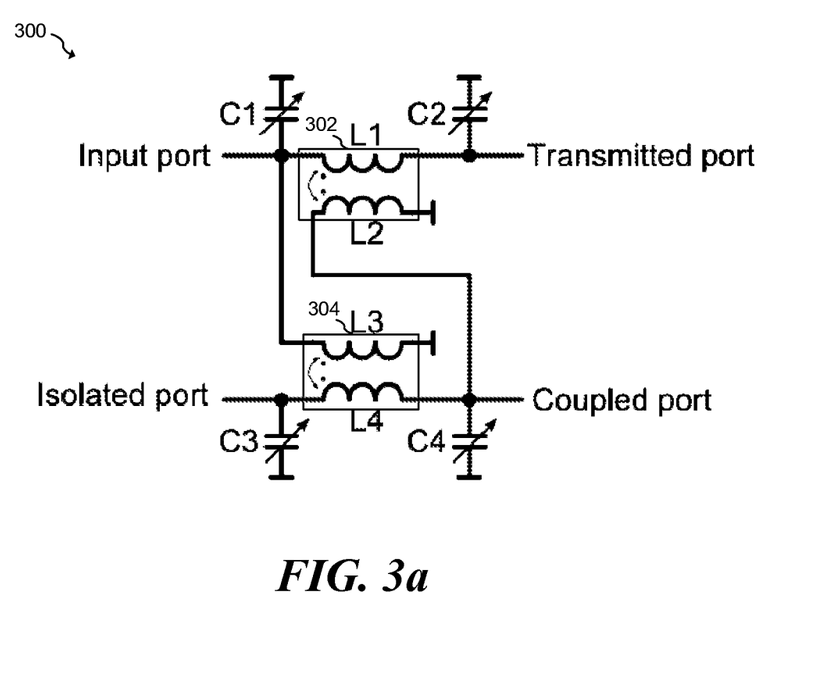
FIGS. 3a-3b illustrate embodiment directional coupler systems that utilize two transformers.

FIG. 3a illustrates tunable directional coupler 300 according to a further embodiment of the present invention. As shown, tunable directional coupler 300 includes two transformers 302 and 304. Transformer 302 has two windings represented by inductance L1 coupled between the input port and the transmitted port, and by inductance L2 coupled between ground and the coupled port. Likewise, transformer 304 has two windings represented by inductance L3 coupled between the input port and ground, and inductance L4 coupled between the isolated port and the coupled port. In an embodiment, tunable directional coupler 300 operates over a wide frequency range, which may be above the frequency where impedance of the windings of transformers 302 and 304 is well above the characteristic impedance of the system ($\omega L \gg Z0$), where L is L1, L2, L3 or L4. In an embodiment, transformers 302 and 304 are integrated on a semiconductor substrate. In such embodiments, the inductance values L1, L2, L3 and L4 may lie between about 0.4 nH and about 10 nH. It should be understood that values of this range may occur in other embodiments depending on the particular technology being used.

In an embodiment, the directivity and insertion loss of tunable directional coupler 300 may be enhanced by adjusting the values of adjustable capacitors C1, C2, C3 and C4. In an embodiment, tunable capacitances C1 and C2 coupled to the input port and transmitted port, respectively, may be tuned to reduce insertion loss, which may degraded by shunt inductance to ground due to winding inductance L3. For example, at a desired operating frequency, C1 and C2 can be tuned such that the shunt effect of L3 is reduced and the mismatch loss in the RF path is minimized. Tunable capacitances C3 and C4, on the other hand, may be adjusted to improve the directivity of tunable direction coupler 300, which is may be degraded by fringing capacitances between the windings of transformers 302 and 304. Tunable capacitances C3 and C4 at the isolated and coupled ports may be used to adjust the complex impedance seen at these ports and, in some embodiments, maximize the directivity in the specified frequency range. In an embodiment, impedance mismatch of between about 10 dB and about 15 dB may be tolerated in some cases. In an embodiment, tunable capacitors C1, C2, C3 and C4 may be implemented using tunable capacitance circuits known in the art.

Figure 3B:
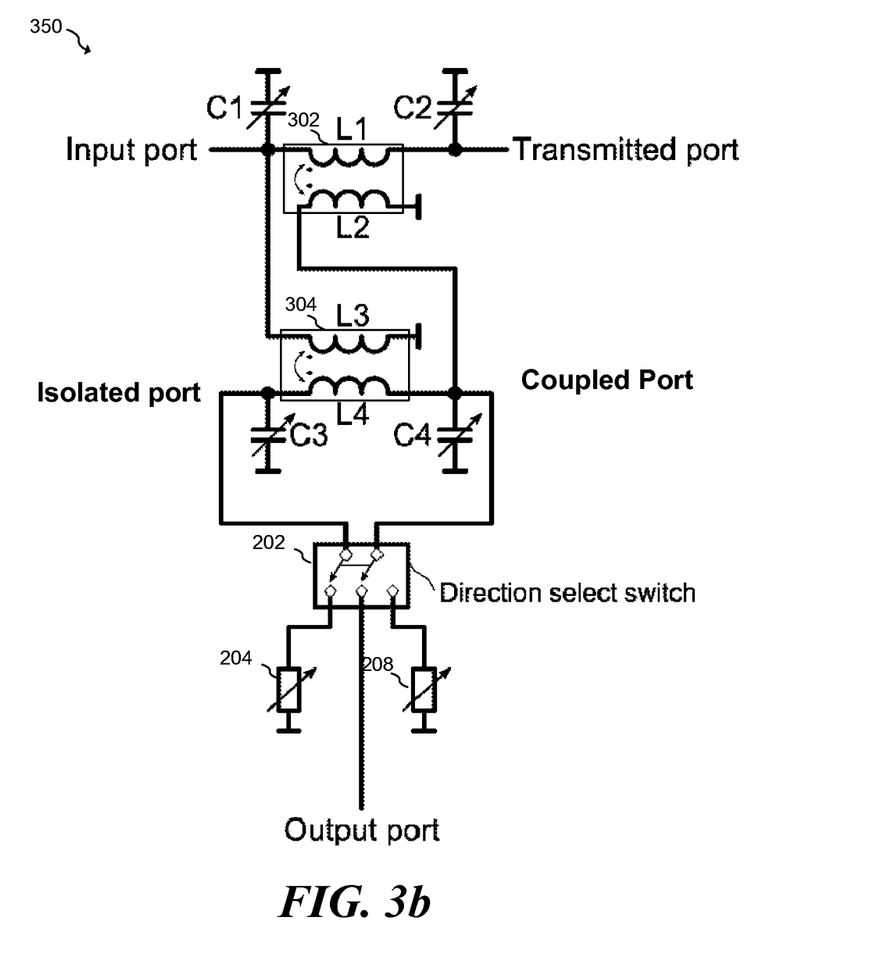

FIG. 3b illustrates tunable directional coupler 350 that utilizes the two-transformer directional coupler shown in FIG. 3a and is further coupled to direction select switch 202 and adjustable resistors 204 and 208. Similar to embodiment directional coupler 200 depicted in FIG. 2a, direction select switch 202 includes one switch that selectively couples the isolated port the output port of the direction select switch to a first termination port coupled to adjustable resistor 204, and includes another switch that selectively couples the coupled port the output port of the direction select switch to a second termination port coupled to adjustable resistor 208. Each of adjustable resistors 204 and 208 may be adjusted to increase the directivity of tunable directional coupler 350. In an embodiment, transformers 302 and 304, adjustable capacitors C1, C2, C3 and C4 direction select switch 202 and adjustable resistors 204 and 208 may be disposed on a single integrated circuit. Alternatively, these components may be disposed on more than one integrated circuit and/or using discrete components or a combination thereof. In further embodiments, direction select switch 202 and adjustable resistors 204 and 208 may be coupled to directional coupler circuits implemented using other architectures.

Figure 4:
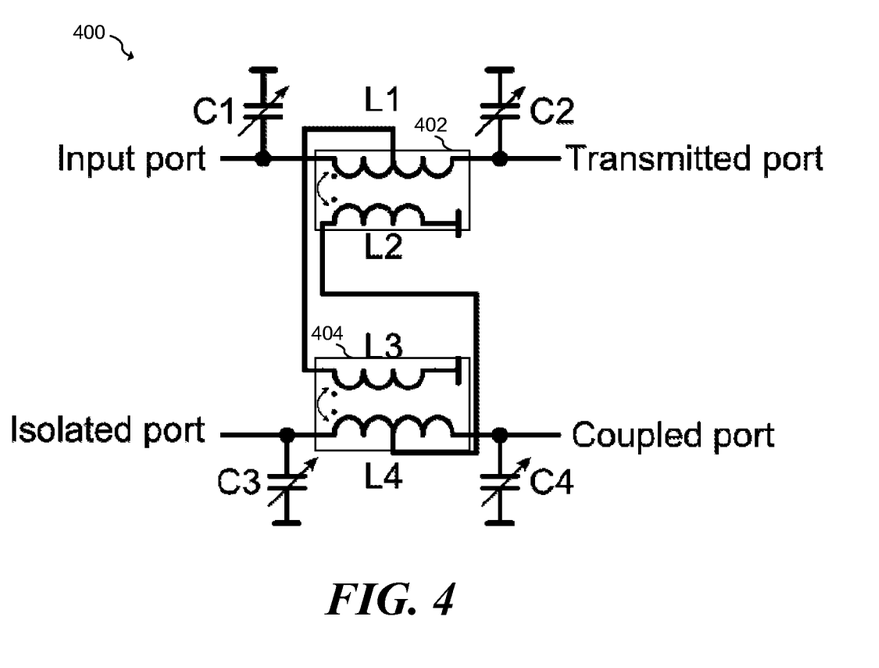
FIG. 4 illustrates a directional coupler according to a further embodiment.

FIG. 4 illustrates an embodiment directional coupler 400 according to a further embodiment of the present invention that includes transformers 402 and 404. Directional coupler 400 is similar to tunable directional coupler 300 illustrated in FIG. 3a with the exception that the winding represented by inductor L3 of transformer 404 is coupled to a center tap of the winding of represented by L1 of transformer 402 instead of directly to the input port of the directional coupler 400. In addition, the winding represented by inductor L2 of transformer 402 is coupled to a center tap of the winding of represented by L4 of transformer 404 instead of directly to the coupled port of directional coupler 400. In a further embodiment, directional coupler 400 may be coupled to a direction select switch and adjustable termination resistors in a similar manner as shown in FIG. 3b with respect to directional coupler 350.

Figure 5A:
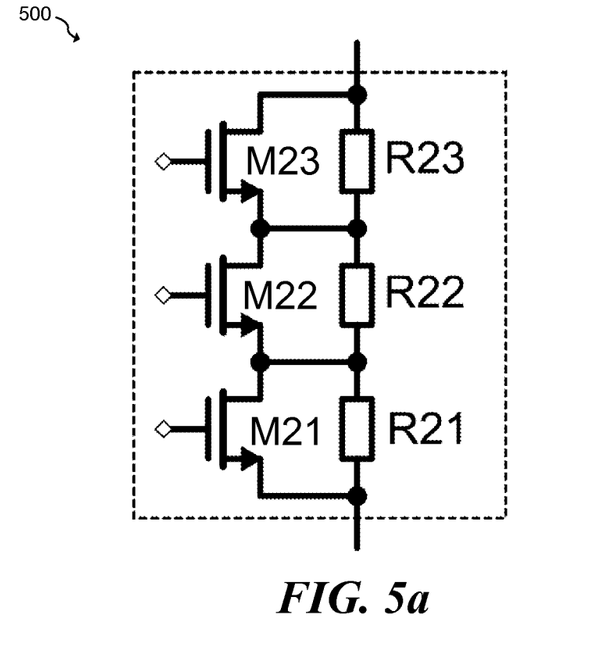
FIGS. 5a-5d illustrate embodiment adjustable impedance circuits.

FIG. 5a illustrates adjustable resistor 500 that may be used to implement various embodiment circuits, such as the adjustable resistance circuits used in embodiment directional coupler systems. As shown, adjustable resistor 500 includes resistors R21, R22 and R23 coupled in series with each other. In addition, transistor M21 is configured to bypass resistor R21, transistor M22 is configured to bypass resistor R22 and transistor M23 is configured to bypass R23. During operation transistors M21, M22 and M23 are turned on and off in various combinations in order to provide an adjustable resistance value. When transistors M21, M22 and M23 are all turned off, adjustable resistor 500 has a maximum resistance value that may be decreased and adjusted by selectively turning on and off transistors M21, M22 and M23 to effect a change in resistance.

Figure 5B:
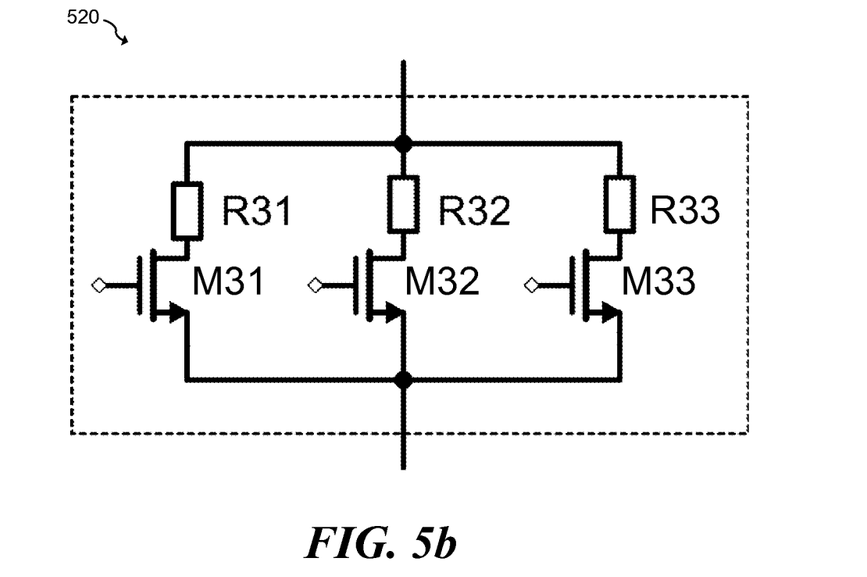

FIG. 5b illustrates adjustable resistor 520 that may be used to implement various embodiment circuits, such as various adjustable resistance circuits used in embodiment directional coupler systems. As shown, adjustable resistor 520 includes resistors R31, R32 and R33 coupled in parallel with each other, wherein each one of resistors R31, R32 and R33 are coupled in series with transistors M31, M32 and M33, respectively. The resistance of adjustable resistor 520 may be adjusted selectively turning on and off transistors M21, M32 and M33.

Figure 5C:
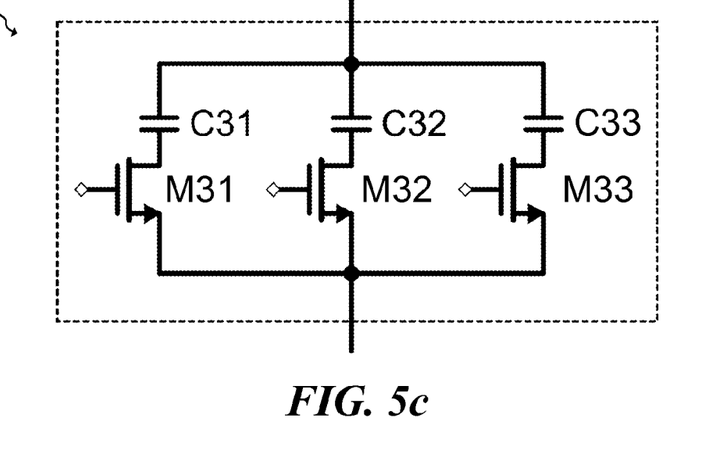

FIG. 5c illustrates adjustable capacitor 530 that may be used to implement various embodiment circuits, such adjustable capacitance circuits used in embodiment directional coupler systems. As shown, adjustable capacitor 530 includes capacitors C31, C32 and C33 coupled in parallel with each other, wherein each one of capacitors C31, C32 and C33 are coupled in series with transistors M31, M32 and M33, respectively. The capacitance of adjustable capacitor 530 may be adjusted selectively turning on and off transistors M21, M32 and M33. These transistors may be turned on and off by applying a HIGH and LOW signal to the gates of these transistors.

Figure 5D:
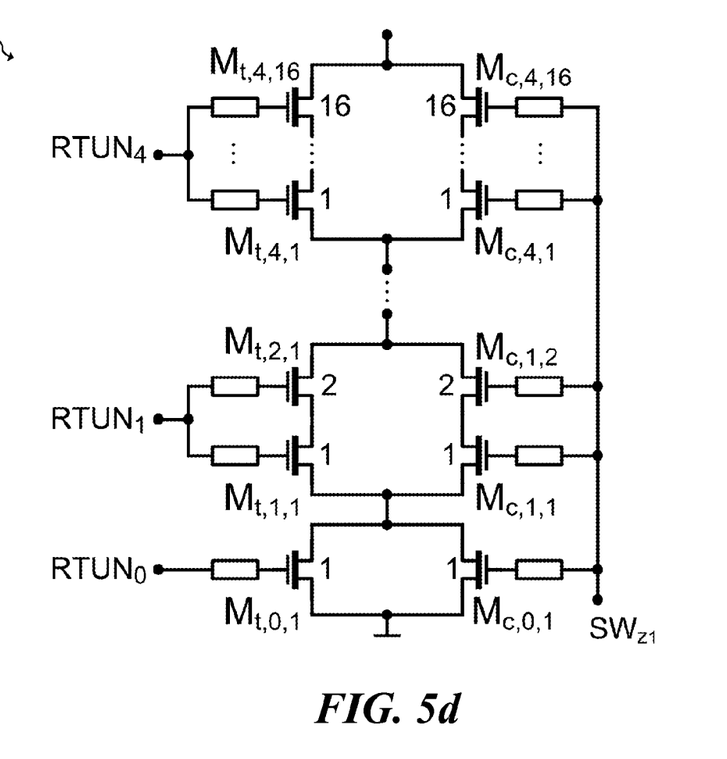

FIG. 5d illustrates an embodiment implementation of a switchable termination network 540 that may be used, for example, to implement switchable termination networks 224 and 226 shown in FIG. 2b. The basic element of the switchable termination network 540 is an RF switch, which in the ON-state behaves mainly as a resistance $R_{ON}$ and in the OFF-state as a capacitance $C_{OFF}$. In various embodiments, the value of ON-resistance and OFF-capacitance are optimized by sizing and stacking of the NMOS devices.

As shown, switchable termination network 540 is implemented using 31 stacked NMOS devices $M_{c,0,1} \ldots M_{c,4,16}$ forming a constant part of the total resistance and additional 31 stacked devices $M_{t,0,1} \ldots M_{t,4,16}$ connected in parallel to the first stack, implementing a tunable portion of the resistance. Each transistor may have a gate resistor in order to minimize the off-capacitance of the respective transistor. This tunable portion of the resistance is split into five groups of switches, each having a binary-weighted number of stacked NMOS devices. The transistors in each group are simultaneously switched ON or OFF corresponding bits of the control word ($RTUN_0 \ldots RTUN_4$). In an embodiment, the constant part of the network controlled by control signal $SW_{T1}$ is always ON in the active state when switchable termination network 540 is activated. This active state may correspond, for example to the state in which switches 230 or 232 in switchable termination network 224 and 226 are closed. In one example, all transistors in the tunable network are equally sized. Alternatively, different sizes may be used. Assuming ON-resistance of one device to be $R_{ON}$, the minimum and maximum values of the termination resistor are given by:

$$R_{T.max} = 31*R_{ON}; \text{ and}$$

$$R_{T.min} = 31*R_{ON}/2.$$

When the network operates in disconnected state all NMOS devices are turned OFF. The remaining capacitance is $2C_{OFF}/31$. Due to the large number of NMOS devices in series (31 devices) the total off capacitance is very low, in the range of several tenth of fF. An advantage of switchable termination network 540 is that the imaginary part of the termination impedance is very low (due low shunt capacitance), which results in wideband coverage with high directivity.

It should be appreciated that in alternative embodiments of the present invention, switchable termination network 540 may be implemented using greater or fewer than 31 transistors depending on the particular embodiment and its specification. In some embodiments, other device types besides NMOS devices, for example PMOS devices, and/or a combination of different device types may be used to implement switchable termination network 540.

Figure 6A:
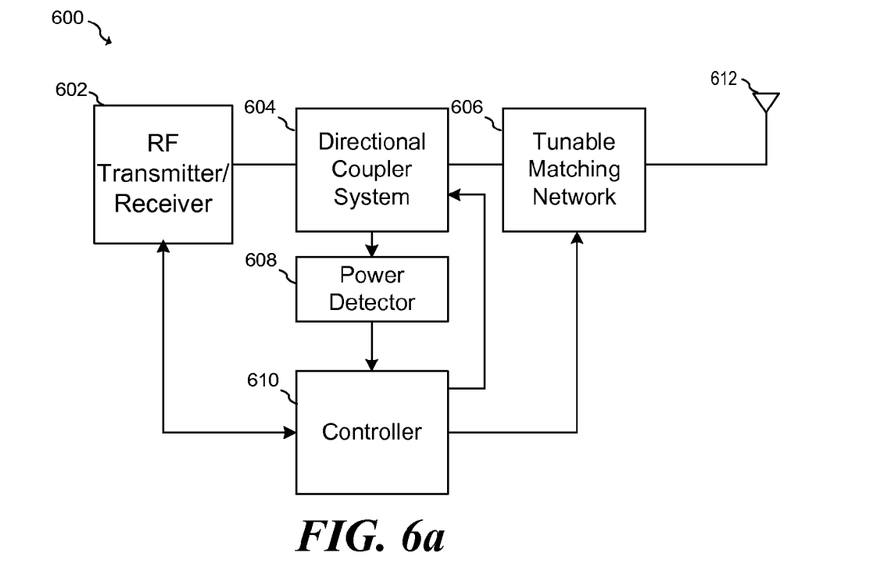
FIGS. 6a-6d illustrate further RF systems that utilize embodiment directional coupler systems.
Figure 6B:
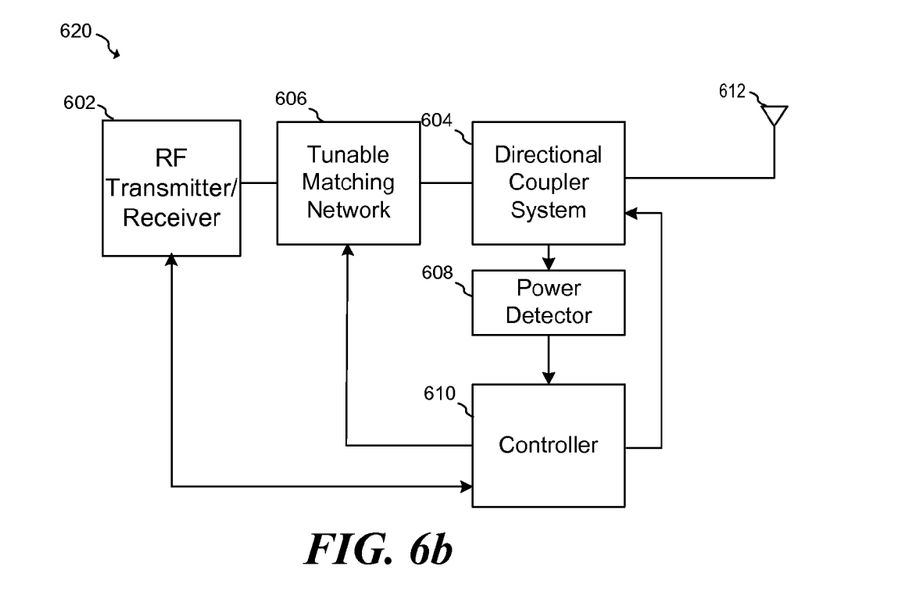

FIG. 6a illustrates RF system 600 according to an embodiment of the present invention. System 600 includes RF transceiver 602 coupled to antenna 612 via embodiment directional coupler system 604 and tunable matching network 606. The output port of directional coupler 604 is coupled to power detector 608, the output of which is coupled to controller 610. In an embodiment, controller 610 adjusts tunable matching network 606 according to the digitized output of power detector 608. When directional coupler 604 detects an impedance mismatch between the RF transceiver 602 and the input to tunable matching network 606, controller 610 adjusts tunable matching network 606 until the measured its mismatch in impedance falls below a predetermined threshold in some embodiments. In some embodiments, controller 610 may be implemented, for example, using a processor, microcontroller, or dedicated system logic. During operation, controller 610 may tune or calibrate resistive terminations within directional coupler system 604 according to various embodiments. Controller 610 may also select which output port of the directional coupler is routed to power detector 608 depending on the measurement being made. RF system 600 may be implemented, for example, in the front end of a cellular telephone, wireless local area network transceiver, or other radio frequency system. In some embodiments, tunable matching network 606 is coupled between RF transceiver 602 and directional coupler 604, as shown in FIG. 6b with respect to system 620.

Figure 6C:
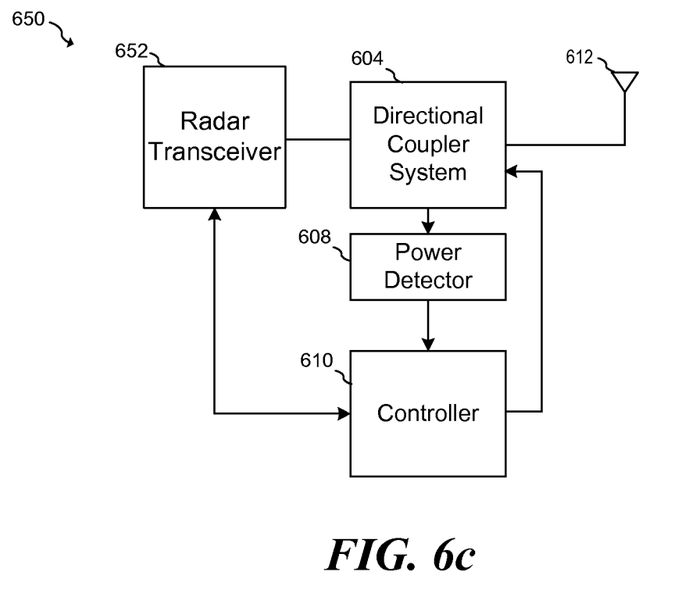

FIG. 6c illustrates embodiment radar system 650 according to another embodiment of the present invention. System 650 includes radar transceiver 652 coupled to antenna 612 via embodiment directional coupler system 604. The output of directional coupler system 604 is coupled to the controller 610 via power detector 608. In an embodiment, directional coupler system 604 measures an incident signal from antenna 612 that may represent a reflected radar pulse. System 650 may be used, for example, a radar system such as automotive or proximity radar systems. Directional coupler system 604 may be implemented, for example, using embodiment directional couplers systems disclosed herein. Other example systems that may utilize embodiment reflection measurement circuits include power monitoring in planar inverted F antenna (PIFA) feed-point tuners.

Figure 6D:
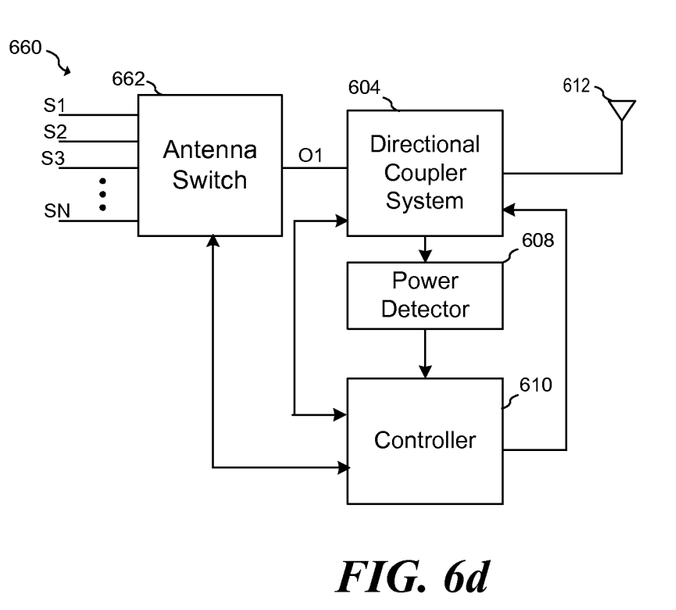

FIG. 6d illustrates embodiment system 660 that includes antenna switch 662 coupled to antenna 612 via embodiment directional coupler system 604. Antenna switch 662 is configured to select and couple one input from among inputs S1 through SN to output node O1. The output port of directional coupler 604 is coupled to controller 610 via power detector 608. System 660 may be used, for example, to measure transmitted and reflected power in the forward and reverse direction by selecting a position of the polarity switch within directional coupler 604. The output of directional coupler 604 may be further used to perform envelope tracking and antenna tuning.

It should be appreciated that the embodiment shown in FIGS. 6a-d are just four examples of the many embodiment systems that may be implemented using embodiment directional couplers.

Figure 7:
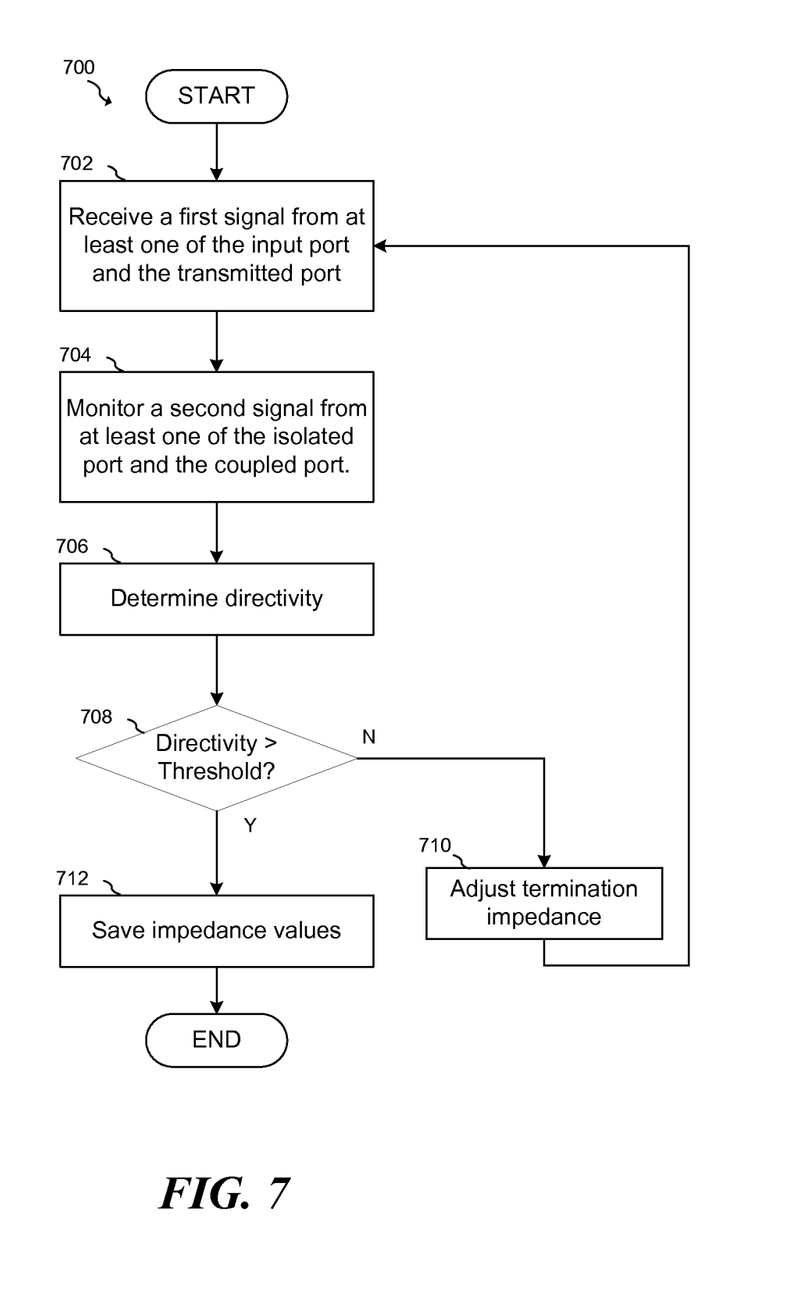
FIG. 7 illustrates a block diagram of an embodiment method.

FIG. 7 illustrates a block diagram of an embodiment method 700 of operating a directional coupler having a plurality of ports comprising an input port, a transmitted port, an isolated port and a coupled port, and an adjustable termination coupled to at least one of the plurality of ports. In particular, method 700 may be performed to calibrate embodiment tunable directional couplers described herein. In step 702, a first signal is received at one of the input port and the transmitted port, and in step 704, a second signal is monitored from at least one of the isolated port and the coupled port. Next, a directivity is determined in step 706. In one embodiment, the first signal is received at the input port, the isolated port is monitored, and the amplitude of the measured second signal is used as a measure of the directional coupler's directivity. In some embodiments, the ratio of the amplitude of the first and second signals is the directivity measure. In such embodiments, a higher directivity corresponds to a lower amplitude of the measured second signal. In another embodiment, the directivity is defined as:

$$\text{Directivity} = -10\log\left(\frac{P_{Isolated}}{P_{Coupled}}\right),$$

where $P_{Isolated}$ is the measured power at the isolated port and $P_{Coupled}$ is the measured power at the coupled port of the directional coupler.

In step 708, the directivity is compared to a threshold, for example, 25 dB. Alternatively, other thresholds may be used. If the determined directivity is not greater than the threshold, then the termination impedance is adjusted in step 710, and steps 702, 704 and 706 are repeated to determine a directivity based on the changed termination impedance. If the directivity determined in step 708 is greater than the threshold, then the current impedance values or the settings used to set the adjustable impedance elements are stored in memory in step 712 and the calibration process ends. If the determined directivity is still not greater than the threshold, then steps 702, 704, 706 and 708 are repeated until the directivity is greater than the threshold.

In some embodiments, the directivity may be maximized instead of or in addition to making sure that a directivity is greater than a threshold. For example, steps 702, 704 and 706 may be repeated until a maximum directivity is found. In some embodiments, steps 702, 704 and 706 may be repeated until a minimum signal level or a maximum signal level is detected at the coupled and/or the isolated ports of the directional coupler.

Embodiments of the present invention are summarized here. Other embodiments can also be understood form the entirety of the specification and the claims filed herein. One general aspect includes a circuit including a directional coupler having a plurality of ports including an input port, a transmitted port, an isolated port and a coupled port; and an adjustable termination coupled to at least one of the plurality of ports.

Implementations may include one or more of the following features. In some embodiments, the adjustable termination is coupled to the isolated port and may include, for example an adjustable resistor and/or an adjustable capacitor. The circuit may further include a direction select switching circuit have a first switch and a second switch, where the first switch is configured to couple the isolated port to a first termination port of the adjustable termination, and the second switch is configured to couple the coupled port to a switch output port in a first switch setting. In such an embodiment, the first switch is configured to couple the isolated port to the switch output port and the second switch is configured to couple the coupled port to a second termination port of the adjustable termination in a second switch setting.

In some embodiments, the adjustable termination includes a first adjustable termination circuit coupled to the first termination port and a second adjustable termination circuit coupled to the second termination port. The first adjustable termination circuit may include a first adjustable resistor and the second adjustable termination circuit may include a second adjustable resistor. In some embodiments, the first adjustable termination circuit further includes a first adjustable capacitor and the second adjustable termination circuit further includes a second adjustable capacitor.

In some embodiments, the directional coupler includes a transformer having a first winding coupled between the input port and the transmitted port and a second winding coupled between the isolated port and the transmitted port, where the first winding is magnetically coupled to the second winding. The directional coupler may include a first transformer having a first winding coupled between the input port and the transmitted port and a second winding coupled between the coupled port and a reference node, where the first winding is magnetically coupled to the first winding; and a second transformer having a third winding coupled between the input port and the reference node and a fourth winding coupled between isolated port and the coupled port, where the third winding is magnetically coupled to the fourth winding. The circuit may further include a first tuning capacitor coupled to the input port; a second tuning capacitor coupled to the transmitted port; a third turning capacitor coupled to the isolated port; and a fourth tuning capacitor coupled to the coupled port. In some embodiments, the circuit where the directional coupler and the adjustable termination are disposed on a same substrate, which may be a same integrated circuit.

In various embodiments, the directional coupler further includes: a single-pole-double throw switch (SPDT) having terminals coupled to the isolated port, the coupled port and a switch output port; a first single pole single throw (STST) switch coupled between the isolated port and a first port of the adjustable termination; a second STST switch coupled between the coupled port and a second port of the adjustable termination, where: in a first switch setting, the SPDT switch couples the isolated port to the switch output port, the first STST switch is open and the second STST switch is closed; and in a second switch setting the SPDT switch couples the coupled port to the switch output port, the first STST switch is closed and the second STST switch is open.

In an embodiment, the directional coupler further includes a single-pole-double throw switch (SPDT) having terminals coupled to the isolated port, the coupled port and a switch output port; and the adjustable termination includes a first plurality of transistors coupled between the coupled port and a reference node, and a second plurality of transistors coupled between the isolated port and the reference node. In a first switch setting, the SPDT switch couples the isolated port to the switch output port, the first plurality of transistors form a high impedance between the coupled port and the reference node, and the second plurality of transistors form a selected impedance between the coupled port and the reference node, where the selected impedance is less than the high impedance. In a second switch setting, the SPDT switch couples the coupled port to the switch output port, the first plurality of transistors form the selected impedance between the coupled port and the reference node, and the second plurality of transistors form the high impedance between the coupled port and the reference node, where the selected impedance is less than the high impedance. Each of the first plurality of transistors and the second plurality of transistors may be implemented, for example, using NMOS transistors and the selected impedance may be formed by on-resistances of transistors of the first plurality of transistors and the second plurality of transistors.

Another general aspect includes a method of operating a circuit including a directional coupler having a plurality of ports including an input port, a transmitted port, an isolated port and a coupled port, and an adjustable termination coupled to at least one of the plurality of ports. The method includes receiving a first signal from at least one of the input port and the transmitted port; monitoring a second signal from at least one of the isolated port and the coupled port; and adjusting the adjustable termination to increase a directivity of the directional coupler based on the monitoring.

Implementations may include one or more of the following features. In an embodiment, the adjustable termination includes an adjustable resistance and/or an adjustable capacitance, and adjusting the adjustable termination includes adjusting the adjustable resistance and/or an adjustable capacitance. The method may further include selecting the second signal from a signal of the isolated port and a signal of the coupled port. In some embodiments, selecting the second signal includes selecting a position of a direction select switch having an output terminal and having input terminals coupled to the coupled port and to the isolated port.

A further general aspect includes a radio frequency (RF) system having a directional coupler that includes a plurality of ports including an input port, a transmitted port, an isolated port and a coupled port; a direction select switch having a first input coupled to the isolated port, a second input coupled to the coupled port, a switch signal output port, a first termination output port, and a second termination output port. In a first state, the direction select switch is configured to couple the isolated port to the switch signal output port and the coupled port to the first termination output port. In a second state the direction select switch is configured to couple the coupled port to the switch signal output port and the isolated port to the second termination output port. The RF system further includes a first adjustable impedance element coupled to the first termination output port and a second adjustable impedance element coupled to the second termination output port.

Implementations may include one or more of the following features. In an embodiment, the first adjustable impedance element and the second adjustable impedance element are adjusted to provide at least 20 db of directivity for the directional coupler. The directional coupler may include a transformer having a first winding coupled between the input port and the transmitted port, and a second winding coupled between the isolated port and the transmitted port, where the first winding is magnetically coupled to the second winding.

In an embodiment, the directional coupler includes: a first transformer having a first winding coupled between the input port and the transmitted port and a second winding coupled between the coupled port and a reference node, where the first winding is magnetically coupled to the first winding; and a second transformer having a third winding coupled between the input port and the reference node and a fourth winding coupled between isolated port and the coupled port, where the third winding is magnetically coupled to the fourth winding. The RF system may further include a power detector coupled to the switch signal output port and may further include an antenna coupled to the transmitted port of the directional coupler, and an antenna switch having an output port coupled to the input port of the directional coupler.

Advantages of embodiments include the ability for to achieve high directivity with low insertion loss in a directional coupler. A further advantage of embodiment directional couplers is the ability to achieve high directivity in a monolithically integrated directional coupler.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A circuit comprising:
a directional coupler having a plurality of ports comprising an input port, a transmitted port, an isolated port and a coupled port, the directional coupler comprising:
 a first transformer having a first winding coupled between the input port and the transmitted port and a second winding coupled between the coupled port and a reference node, wherein the first winding is magnetically coupled to the second winding; and
 a second transformer having a third winding coupled between the input port and the reference node and a fourth winding coupled between isolated port and the coupled port, wherein the third winding is magnetically coupled to the fourth winding; and
an adjustable termination coupled to at least one of the plurality of ports.

2. The circuit of claim 1, wherein the adjustable termination is coupled to the isolated port.

3. The circuit of claim 1, wherein the adjustable termination comprises an adjustable resistor.

4. The circuit of claim 1, wherein the adjustable termination comprises an adjustable capacitor.

5. The circuit of claim 1, further comprising a direction select switching circuit comprising a first switch and a second switch, wherein:
the first switch is configured to couple the isolated port to a first termination port of the adjustable termination, and the second switch is configured to couple the coupled port to a switch output port in a first switch setting; and
the first switch is configured to couple the isolated port to the switch output port and the second switch is configured to couple the coupled port to a second termination port of the adjustable termination in a second switch setting.

6. The circuit of claim 5, wherein the adjustable termination comprises:
a first adjustable termination circuit coupled to the first termination port; and
a second adjustable termination circuit coupled to the second termination port.

7. The circuit of claim 6, wherein:
the first adjustable termination circuit comprises a first adjustable resistor; and
the second adjustable termination circuit comprises a second adjustable resistor.

8. The circuit of claim 7, wherein:
the first adjustable termination circuit further comprises a first adjustable capacitor; and
the second adjustable termination circuit further comprises a second adjustable capacitor.

9. The circuit of claim 1, comprising:
a first tuning capacitor coupled to the input port;
a second tuning capacitor coupled to the transmitted port;
a third turning capacitor coupled to the isolated port; and
a fourth tuning capacitor coupled to the coupled port.

10. The circuit of claim 1, wherein the directional coupler and the adjustable termination are disposed on a same substrate.

11. The circuit of claim 1, wherein the directional coupler and the adjustable termination are disposed on a same integrated circuit.

12. The circuit of claim 1, wherein the directional coupler further comprises:
- a single-pole-double throw switch (SPDT) having terminals coupled to the isolated port, the coupled port and a switch output port;
- a first single pole single throw (STST) switch coupled between the isolated port and a first port of the adjustable termination;
- a second STST switch coupled between the coupled port and a second port of the adjustable termination, wherein:
  - in a first switch setting, the SPDT switch couples the isolated port to the switch output port, the first STST switch is open and the second STST switch is closed; and
  - in a second switch setting the SPDT switch couples the coupled port to the switch output port, the first STST switch is closed and the second STST switch is open.

13. The circuit of claim 1, wherein:
the directional coupler further comprises a single-pole-double throw switch (SPDT) having terminals coupled to the isolated port, the coupled port and a switch output port; and
the adjustable termination comprises a first plurality of transistors coupled between the coupled port and a reference node, and a second plurality of transistors coupled between the isolated port and the reference node, wherein
  - in a first switch setting, the SPDT switch couples the isolated port to the switch output port, the first plurality of transistors form a high impedance between the coupled port and the reference node, and the second plurality of transistors form a selected impedance between the coupled port and the reference node, wherein the selected impedance is less than the high impedance, and
  - in a second switch setting, the SPDT switch couples the coupled port to the switch output port, the first plurality of transistors form the selected impedance between the coupled port and the reference node, and the second plurality of transistors form the high impedance between the coupled port and the reference node, wherein the selected impedance is less than the high impedance.

14. The circuit of claim 13, wherein each of the first plurality of transistors and the second plurality of transistors are NMOS transistors, and the selected impedance is formed by ON-resistances of transistors of the first plurality of transistors and the second plurality of transistors.

15. A method of operating a circuit comprising a directional coupler having a plurality of ports comprising an input port, a transmitted port, an isolated port and a coupled port, and an adjustable termination coupled to at least one of the plurality of ports, the method comprising:
receiving a first signal from at least one of the input port and the transmitted port, the input port being coupled to the transmitted port by a first winding of a first transformer, the input port being further coupled to a reference node by a third winding of a second transformer;
monitoring a second signal from at least one of the isolated port and the coupled port, the coupled port being coupled to the reference node by a second winding of the first transformer, the first winding being magnetically coupled to the second winding, the coupled port being further coupled to the isolated port by a fourth winding of the second transformer, the fourth winding being magnetically coupled to the third winding; and
adjusting the adjustable termination to increase a directivity of the directional coupler based on the monitoring.

16. The method of claim 15, wherein the adjustable termination comprises an adjustable resistance, and adjusting the adjustable termination comprises adjusting the adjustable resistance.

17. The method of claim 15, wherein the adjustable termination comprises an adjustable capacitance, and adjusting the adjustable termination comprises adjusting the adjustable capacitance.

18. The method of claim 15, further comprising selecting the second signal from a signal of the isolated port and a signal of the coupled port.

19. The method of claim 18, wherein selecting the second signal comprises selecting a position of a direction select switch having an output terminal and having input terminals coupled to the coupled port and to the isolated port.

20. A radio frequency (RF) system comprising:
a directional coupler having a plurality of ports comprising an input port, a transmitted port, an isolated port and a coupled port, the directional coupler comprising:
  - a first transformer having a first winding coupled between the input port and the transmitted port and a second winding coupled between the coupled port and a reference node, wherein the first winding is magnetically coupled to the second winding; and
  - a second transformer having a third winding coupled between the input port and the reference node and a fourth winding coupled between isolated port and the coupled port, wherein the third winding is magnetically coupled to the fourth winding;
a direction select switch having a first input coupled to the isolated port, a second input coupled to the coupled port, a switch signal output port, a first termination output port, and a second termination output port, wherein, in a first state, the direction select switch is configured to couple the isolated port to the switch signal output port and the coupled port to the first termination output port, and in a second state the direction select switch is configured to couple the coupled port to the switch signal output port and the isolated port to the second termination output port;
a first adjustable impedance element coupled to the first termination output port; and
a second adjustable impedance element coupled to the second termination output port.

21. The RF system of claim 20, wherein the first adjustable impedance element and the second adjustable impedance element are adjusted to provide at least 20 dB of directivity for the directional coupler.

22. The RF system of claim 20, further comprising a power detector coupled to the switch signal output port.

23. The RF system of claim 22, further comprising an antenna coupled to the transmitted port of the directional coupler, and an antenna switch having an output port coupled to the input port of the directional coupler.

* * * * *